(12) United States Patent
Lee et al.

(10) Patent No.: US 8,093,104 B1
(45) Date of Patent: Jan. 10, 2012

(54) MULTI-CHIP STACKING METHOD TO REDUCE VOIDS BETWEEN STACKED CHIPS

(75) Inventors: Kuo-Yuan Lee, Kaohsiung (TW);
Yung-Hsiang Chen, Kaohsiung (TW);
Wen-Chun Chiu, Kaohsiung (TW)

(73) Assignee: Walton Advanced Engineering, Inc., Kaohsiung (TW)

( * ) Notice: Subject to any disclaimer, the term of this patent is extended or adjusted under 35 U.S.C. 154(b) by 0 days.

(21) Appl. No.: 13/042,136

(22) Filed: Mar. 7, 2011

(30) Foreign Application Priority Data

Sep. 23, 2010 (TW) ................................. 99132235 A

(51) Int. Cl.
*H01L 21/00* (2006.01)

(52) U.S. Cl. ........ 438/118; 438/106; 438/113; 438/462; 257/E21.499; 257/E21.503; 257/E21.512

(58) Field of Classification Search .................... 438/63; 257/E21.5, E21.512
See application file for complete search history.

(56) References Cited

U.S. PATENT DOCUMENTS
2008/0150120 A1* 6/2008 Nishimura et al. ........... 257/690
* cited by examiner

*Primary Examiner* — Cheung Lee
(74) *Attorney, Agent, or Firm* — Muncy, Geissler, Olds & Lowe, PLLC

(57) ABSTRACT

A multi-chip stacking method to reduce voids between stacked chips is revealed. A first chip is disposed on a substrate, and a plurality of first bonding wires are formed by wire bonding to electrically connect the first chip and the substrate. A second chip is disposed on an active surface of the first chip where a dielectric layer and a FOW adhesive (film over wire) adhesive are attached onto a back surface of the second chip. The FOW adhesive partially encapsulates the first bonding wires and adheres to the active surface of the first chip. Then, the substrate is placed in a pressure oven to provide a positive pressure greater than one atm during thermally curing the FOW adhesive with exerted pressures. Accordingly, voids can be reduced inside the FOW adhesive during the multi-chip stacked processes where issues of poor adhesion and popcorn between chips can be avoided.

17 Claims, 12 Drawing Sheets

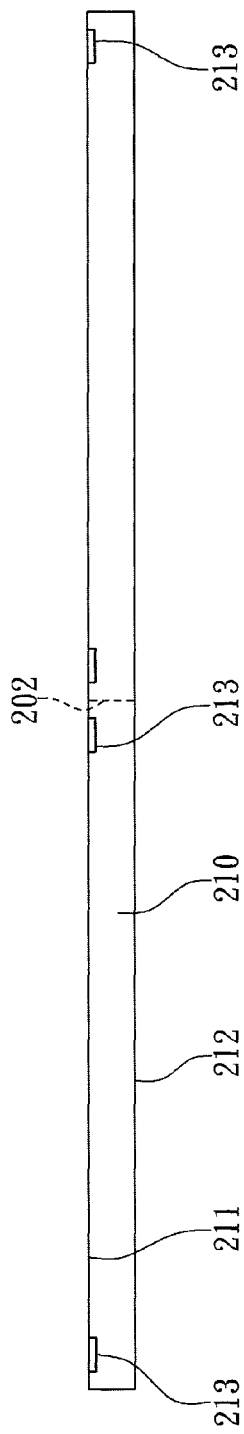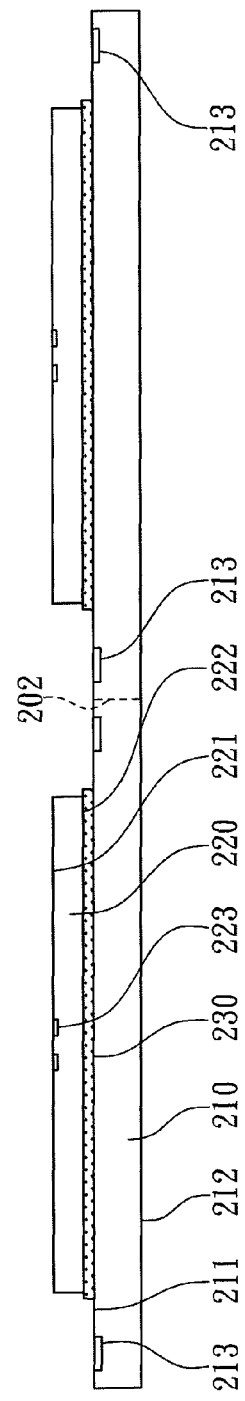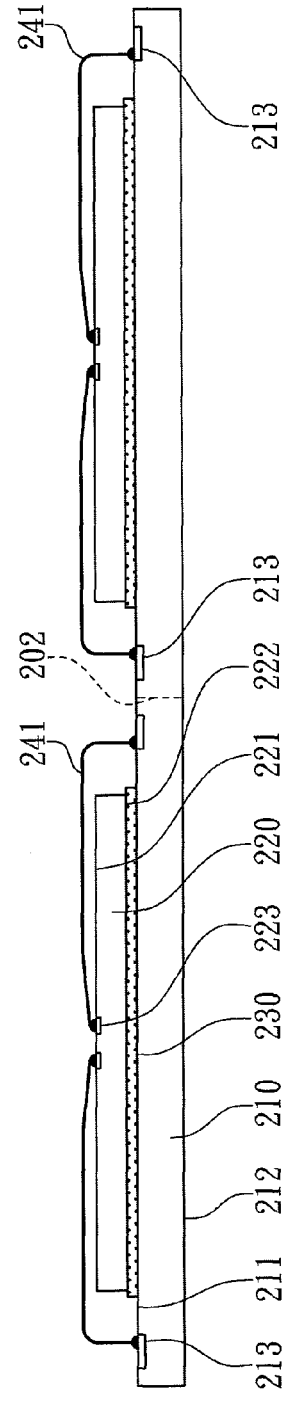

US 8,093,104 B1

MULTI-CHIP STACKING METHOD TO REDUCE VOIDS BETWEEN STACKED CHIPS

FIELD OF THE INVENTION

The present invention relates to packaging technology of semiconductor devices, more specifically to a multi-chip stacking method to reduce voids between stacked chips with long wire connections.

BACKGROUND OF THE INVENTION

In order to meet the requirements of portable electronic devices for minimization and high speed operation with more functions, the development of new technologies has been changed in quarterly bases. Therefore, multi-chip packages have been quite popular to increase the functions or/and the memory capacities within a single package. Chip-on-chip stacked packages have been developed to package two or more chips vertically stacked on each another within a single package to expect a smaller footprint.

As shown in FIG. 1, a conventional multi-chip package (MCP) 100 with chip-on-chip configuration is to vertically stack a plurality of chips 120 and 150 on a substrate 110. Generally speaking, during the packaging processes of the MCP, a first chip 120 is disposed on the substrate 110 by an adhesive 130, then the bonding pads 123 on the first active surface 121 of the first chip 120 are electrically connected to the bonding fingers 113 on the substrate 110 by a plurality of first bonding wires 141 formed by wire bonding. Then, a second chip 150 is disposed on top of the first chip 120 where a FOW adhesive (Film On Wire) adhesive 162 is pre-disposed on the first active surface 121 of the first chip 120 by dispensing or by printing. The FOW adhesive 162 is attached to the back surface 152 of the second chip 150 and partially encapsulates the first bonding wires 141 where FOW adhesive 162 has a thickness more than the loop heights of the first bonding wires 141. However, the chip bonding operation of the second chip 150 decreases the thickness of the FOW adhesive 162 so that the first bonding wires 141 may physically contact the back surface 152 of the second chip 150. After curing the FOW adhesive 162, the FOW adhesive 162 can support the second chip 150 for further wire bonding processes. After stacking the second chip 150, the second bonding pads 153 of the second chip 150 are electrically connected to the bonding fingers 113 by a plurality of second bonding wires 142 formed by wire bonding. A molding compound 180 is formed on the substrate 110 to encapsulate the first chip 120, the second chip 150, the bonding wires 141 and 142.

Since the FOW adhesive is very expensive, there are several attempts to reduce the cost of FOW adhesive where reducing the thickness of FOW adhesive is one of them. However, when the thickness of FOW adhesive 162 is reduced, the first bonding wires 141 would more easily contact the back surface 152 of the second chip 150 leading to electrical short, especially in packages with long bonding wires. Furthermore, during disposing the second chip 150 to the first chip 120, the FOW adhesive 162 is like paste where bubbles easily trap inside the FOW adhesive 162 due to the present of bonding wires 141. Once many bubbles are trapped inside the FOW adhesive 162, the encapsulation and adhesion of the FOW adhesive 162 are greatly reduced leading to poor adhesion between the first chip 120 and the second chip 150. Moreover, after curing the FOW adhesive 162, the trapped bubbles experience raised temperature during IC operation and rapidly expand causing popcorn leading to delamination and cracking between the chips so that the MCP would be damaged and failed mechanically and electrically.

SUMMARY OF THE INVENTION

The main purpose of the present invention is to provide a multi-chip stacking method to reduce voids between stacked chips to reduce the bubbles trapped inside the FOW adhesive. It is feasible to use thinner FOW adhesive to encapsulate long bonding wires without poor adhesion between stacked chips and without popcorn issues.

The second purpose of the present invention is to provide a multi-chip stacking method to reduce voids between stacked chips to prevent physical contact of bonding wires to the back surface of an upper stacked chip on top with good encapsulation over the bonding wires.

According to the present invention, a multi-chip stacking method to reduce voids between stacked chips is revealed. Firstly, a substrate is provided where the substrate has a top surface with a plurality of bonding fingers disposed on the top surface. Then, the first chip is disposed on the substrate where the first back surface of the first chip is attached to the top surface of the substrate by an adhesive. The first chip has a plurality of first bonding pads disposed on its active surface. After the adhesive is thermally cured, a plurality of first bonding wires are formed by wire bonding to electrically connect the first bonding pads to the bonding fingers. Then, a second chip is disposed on top of the first active surface of the first chip by a FOW adhesive where the second chip has a second active surface, a second back surface, and a plurality of second bonding pads. The FOW adhesive is formed on a dielectric layer attached onto the second back surface where the FOW adhesive encapsulates a plurality of loop-height sections of the first bonding wires above the first active surface and is attached to the first active surface of the first chip. Then, the substrate is placed in a pressure oven and the FOW adhesive is thermally cured with exerted pressures to provide a positive pressure greater one atm to reduce the bubbles trapped inside the FOW adhesive. Finally, a plurality of second bonding wires are formed to electrically connect the second bonding pads to the bonding fingers.

The multi-chip stacking method to reduce voids between stacked chips according to the present invention has the following advantages and effects:

1. Through a specific processing sequence of thermally curing FOW adhesive with exerted pressures as a technical mean, the substrate is placed inside a pressure oven with a positive pressure greater than one atm to reduce the bubbles trapped inside the FOW adhesive and to encapsulate the bonding wires so that a thinner FOW adhesive can be used for MCP process to avoid poor adhesion between stacked chips and any possible popcorn issues.
2. Through attaching dielectric layers and FOW adhesive on the back surface of the stacked chip on top as a technical mean, the physical contact of bonding wires to the back surface of the stacked chip on top can be avoided and the bonding wires can be fully encapsulated.
3. Through a plasma cleaning before wire bonding processes as a technical mean, the surfaces of the bonding pads and the surface of the substrate can be cleaned and the contamination can be removed to enhance the bondability between bonding wires and the bonding pads/the bonding fingers and to increase the adhesion between the substrate and the molding compound.

DESCRIPTION OF THE DRAWINGS

FIGS. 3A to 3H are cross-sectional views of components illustrating the steps of the multi-chip stacking method according to the first embodiment of the present invention.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
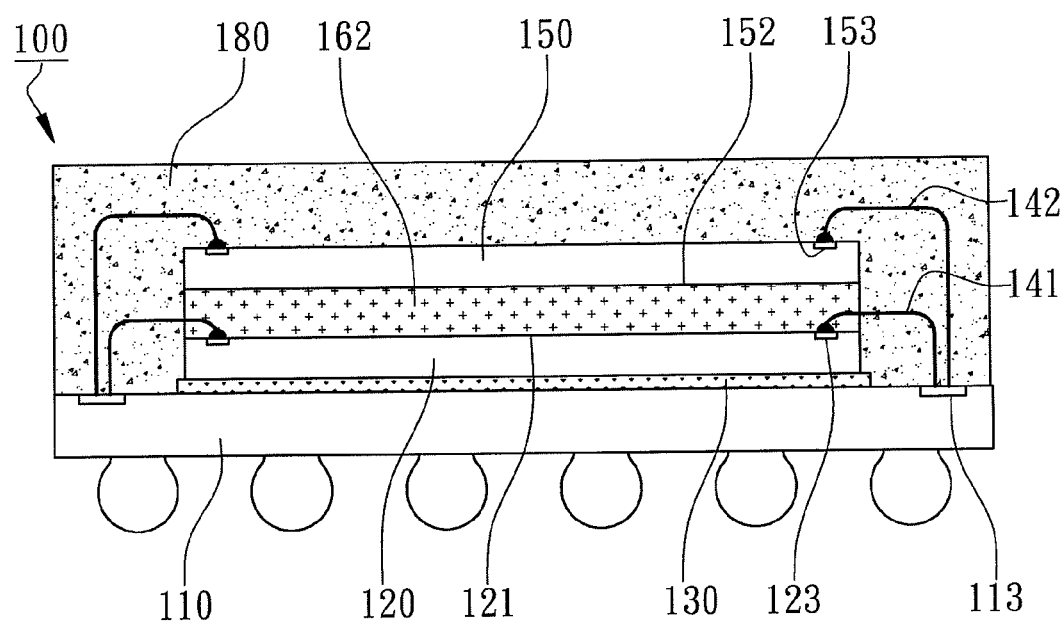
FIG. 1 is a cross-sectional view of a conventional multi-chip package.
Figure 2:
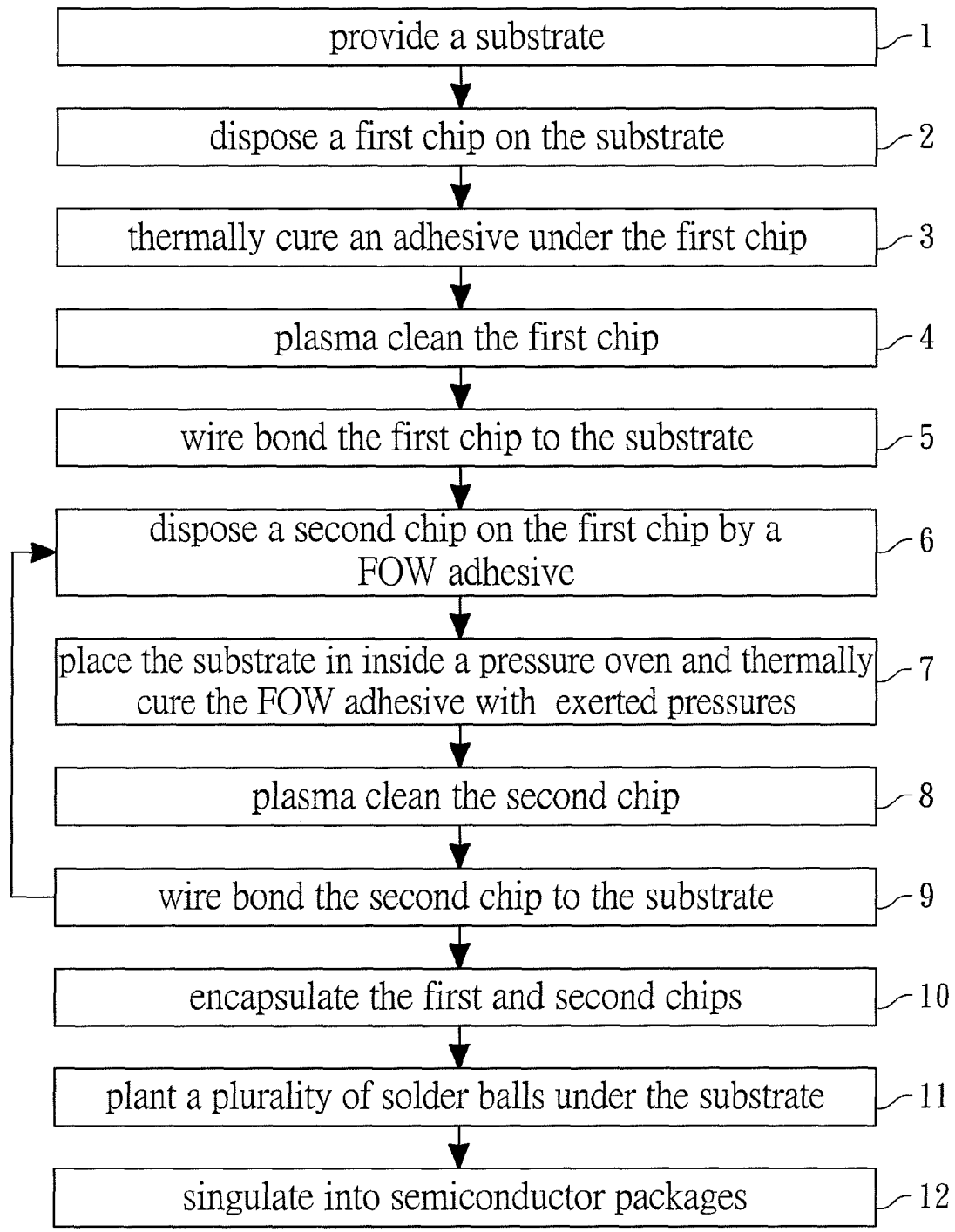
FIG. 2 is the block diagrams of the process flow of the multi-chip stacking method to reduce voids between stacked chips according to the first embodiment of the present invention.

According to the first embodiment of the present invention, a multi-chip stacking method to reduce voids between stacked chips was illustrated in FIG. 2 for the block diagrams of the process flow and from FIG. 3A to FIG. 3H for the cross-sectional views of each processing step.

Figure 3D:
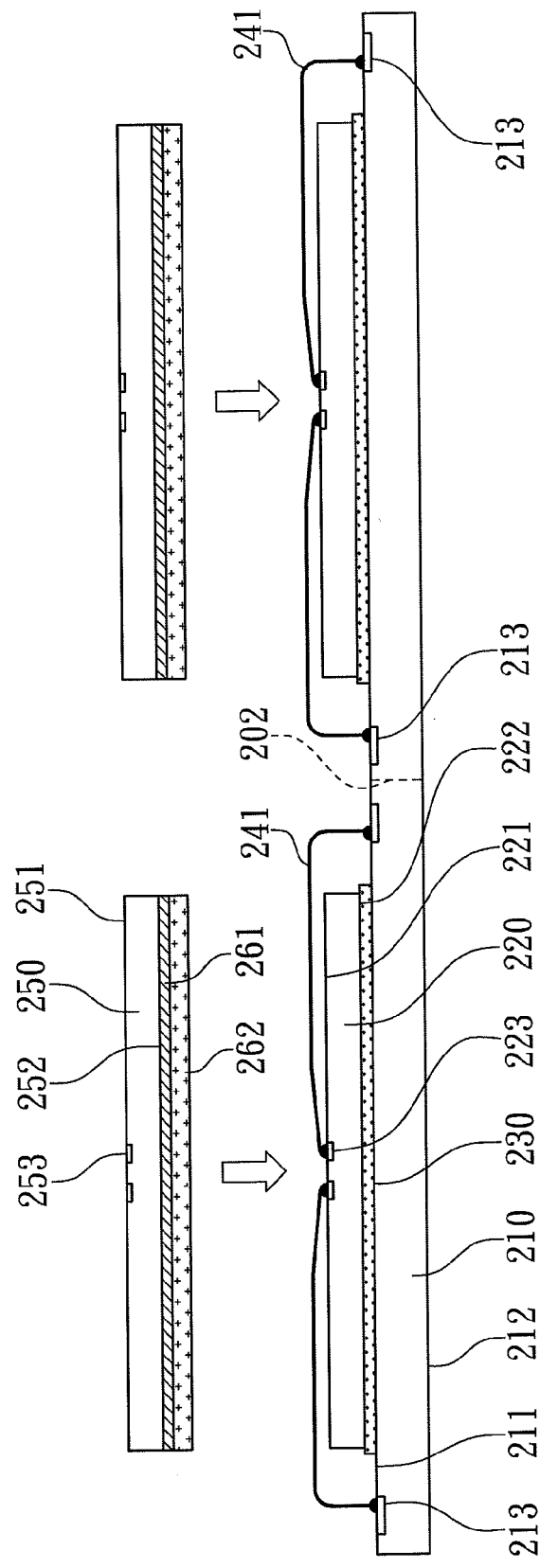
Figure 3E:
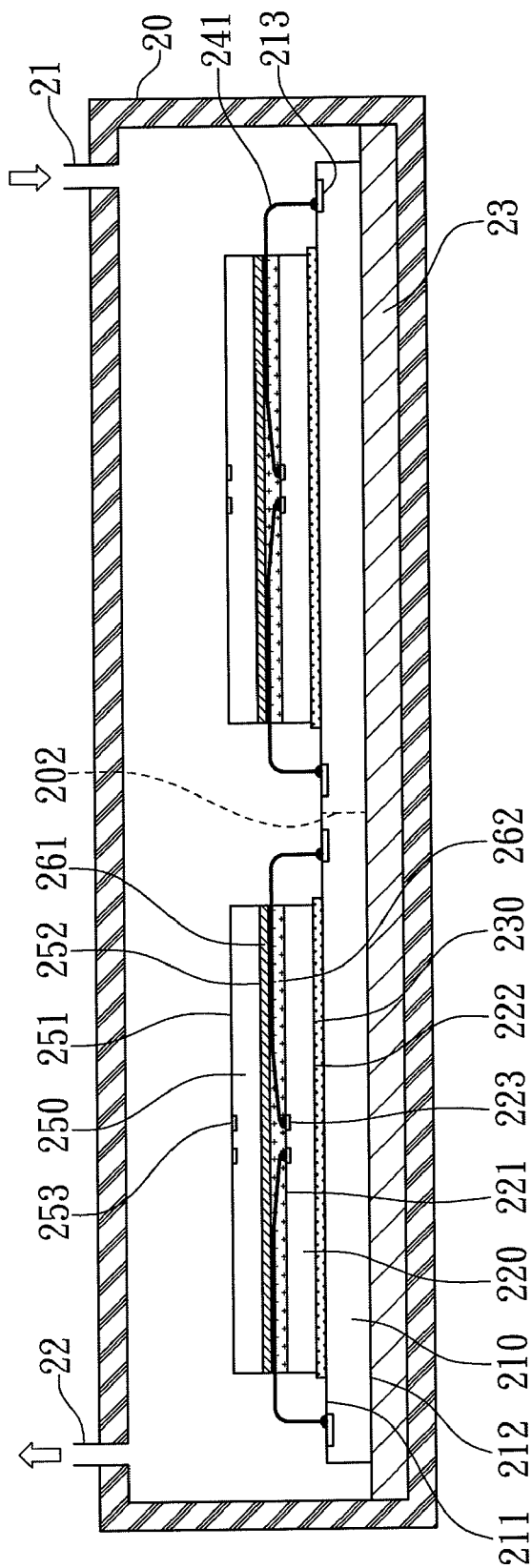
Figure 3F:
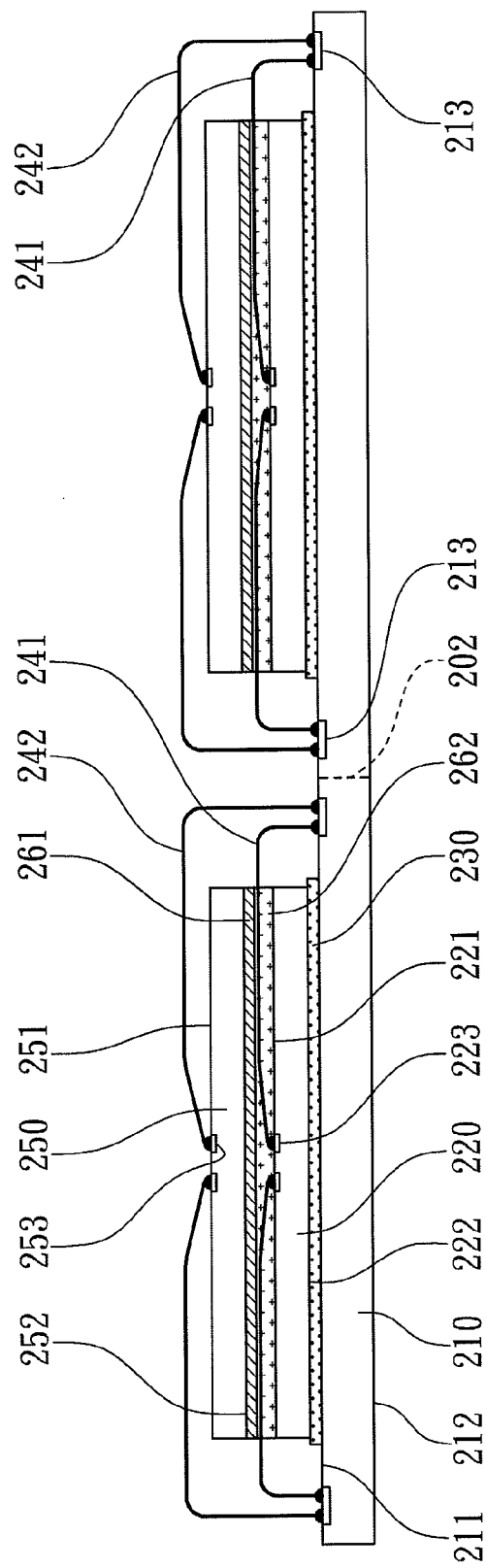
Figure 3G:
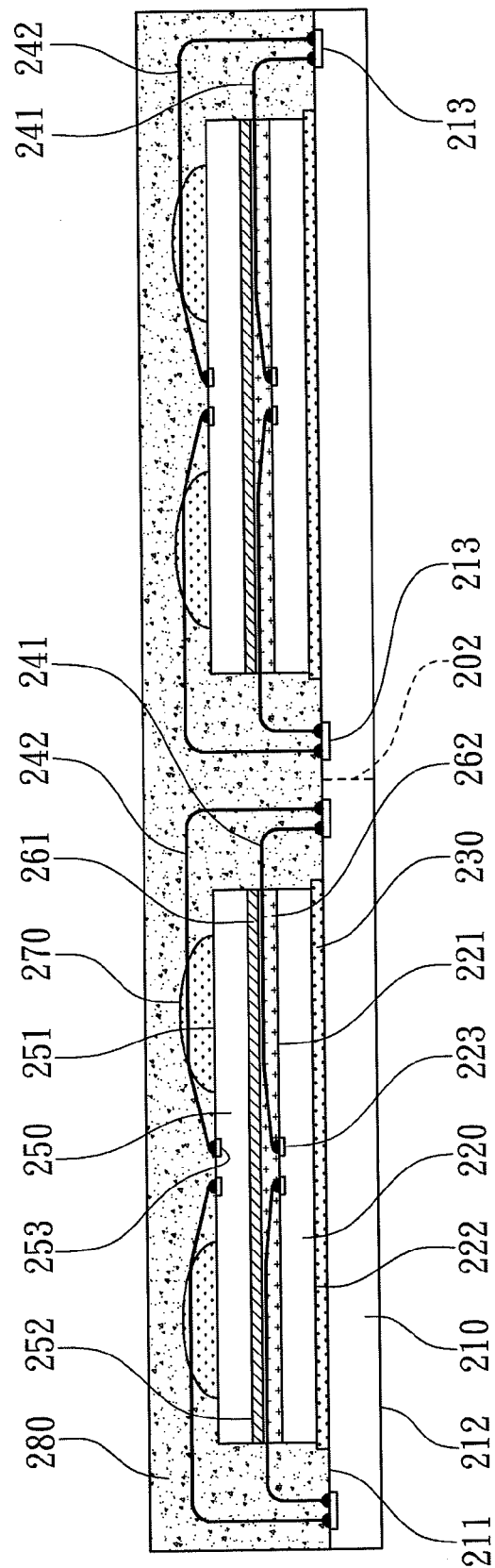
Figure 3H:
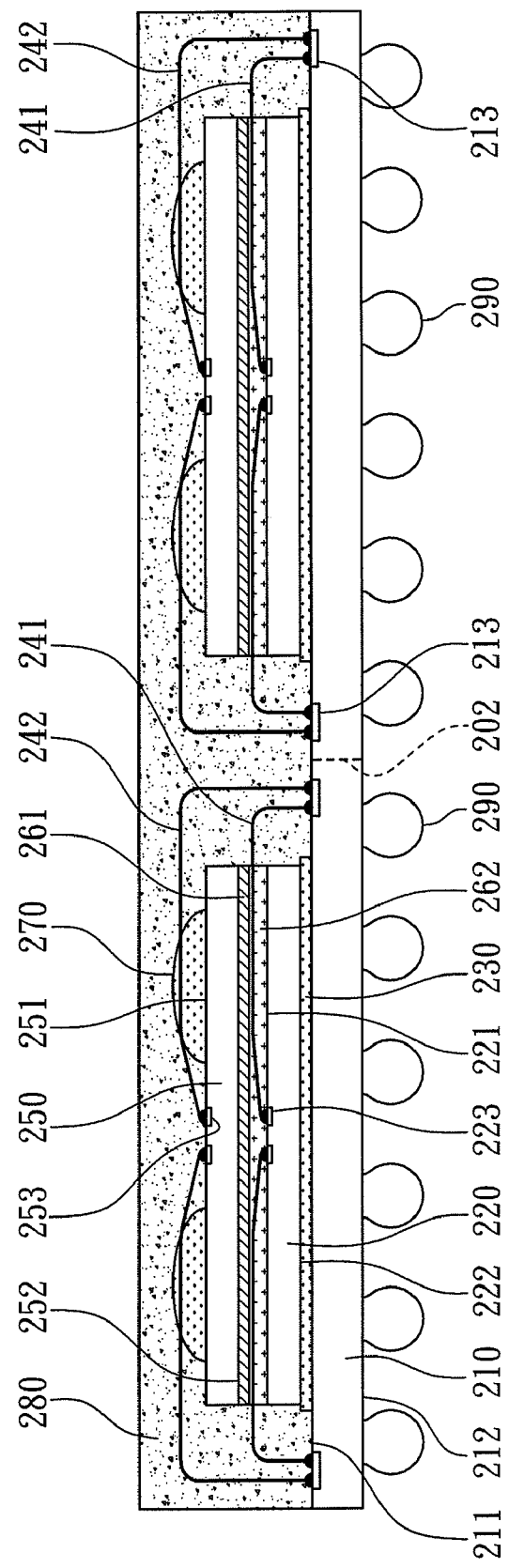
Figure 4:
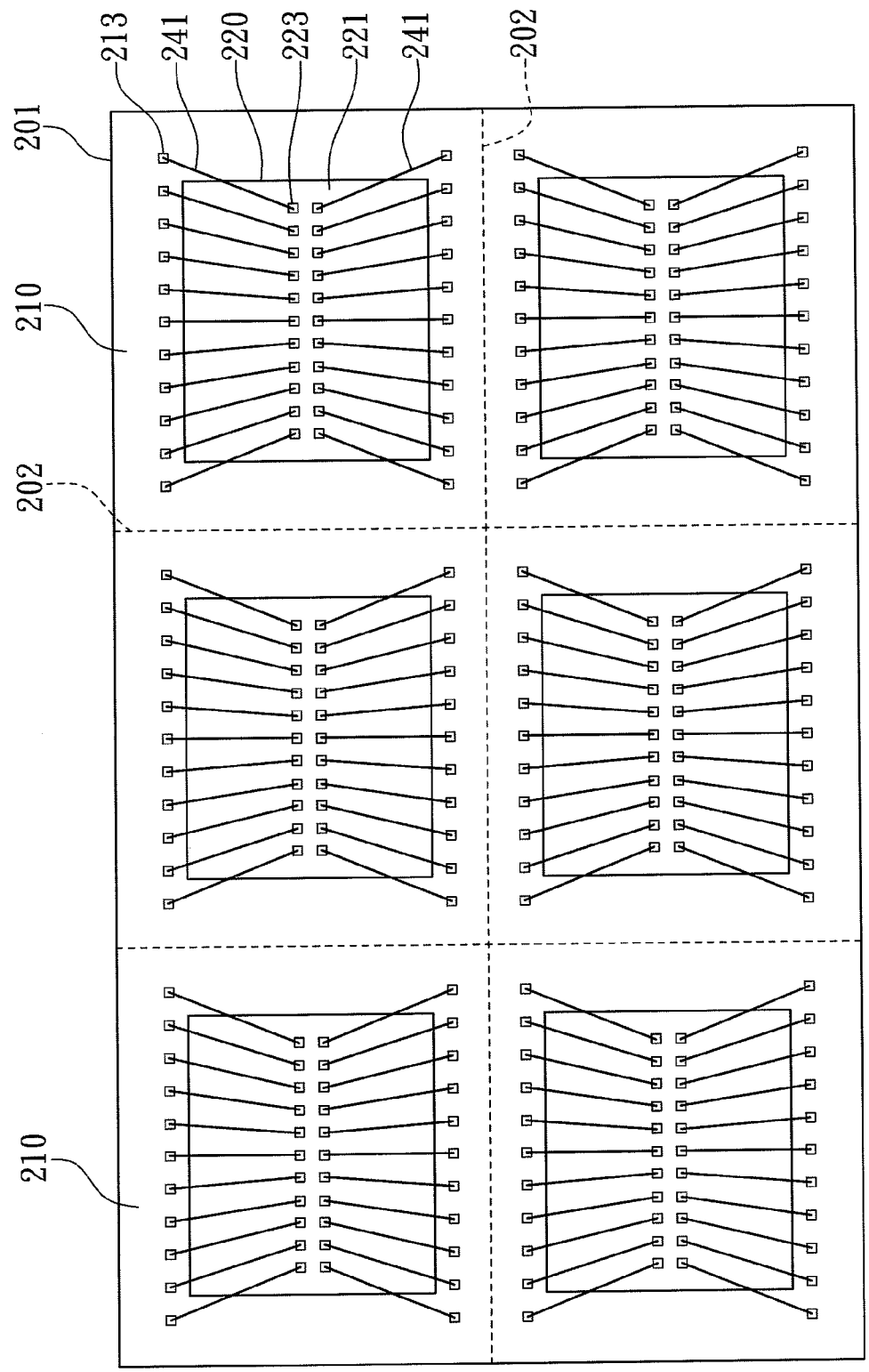
FIG. 4 is a top view of the substrate illustrating the step of wire bonding the first chip to the substrate during the multi-chip stacking method according to the first embodiment of the present invention.
Figure 5:
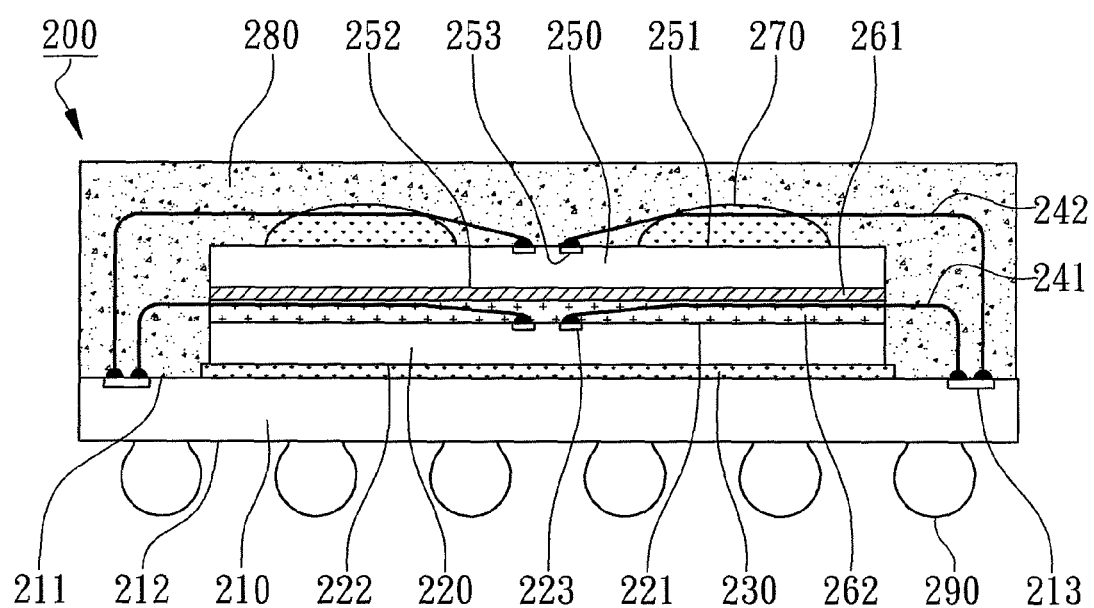
FIG. 5 is a cross-sectional view of a multi-chip package fabricated by the multi-chip stacking method according to the first embodiment of the present invention.

The multi-chip stacking method to reduce voids between stacked chips according to the present invention comprises the following processing steps 1 to 12 as shown in FIG. 2. Therein, step 1 is to provide a substrate 210 as shown in FIG. 3A; step 2 is to dispose a first chip 220 on the substrate 210 as shown in FIG. 3B; step 3 is to thermally cure an adhesive 230 under the first chip 220 referring to FIG. 3B again; step 4 is to plasma clean the first chip 220 referring to FIG. 3B again, step 5 is to wire bond the first chip 220 to the substrate 210 as shown in FIGS. 3C and 4; step 6 is to dispose a second chip 250 on the first chip 220 by a FOW adhesive 262 as shown in FIG. 3D; step 7 is to place the substrate 210 in inside a pressure oven 20 and to thermally cure the FOW adhesive 262 with exerted pressures as shown in FIG. 3E; step 8 is to plasma clean the second chip; step 9 is to wire bond the second chip 250 to the substrate 210 as shown in FIG. 3F; step 10 is to encapsulate the first and second chips 220 and 250 as shown in FIG. 3G; step 11 is to plant a plurality of solder balls 290 under the substrate 210 as shown in FIG. 3H; and, step 12 is to singulate into semiconductor packages 200 as shown in FIG. 5. Moreover, step 1 to step 3, and step 5 to step 7 are the necessary processing steps and all the rest are optional.

Firstly, FIG. 3A shows the substrate 210 is provided in step 1. The substrate 210 has a top surface 211, a bottom surface 212, and a plurality of bonding fingers 213 disposed on the top surface 211. The substrate 210 is a chip carrier for multi-chip packages which can be a MCP packaging unit with a specific dimension included in a substrate strip 201 having many packaging units which can be singulated into individual MCPs after the singulating step 12. As also shown in FIG. 4, when the substrate 210 is still included in the substrate strip 201 before singulation, a plurality of substrates 210 are integrally formed as a whole and arranged in an array where a plurality of scribe lines 202 for package sawing are defined between the substrates 210. Usually the substrate 210 is a printed circuit board with a single layer or doubt layers of circuitry. When the substrate 210 is a multi-layer printed circuit board, the substrate 210 further comprise a plurality of plated through holes (PTH) to electrically connecting a plurality of wiring layers in the substrate 210 not shown in the figures. Alternatively, the substrate 210 also can be chosen from a flexible wiring film, a leadless leadframe with a back tape, a ceramic wiring substrate, a leadframe or a metal carrying sheet. The bonding fingers 213 can be conductive metals chosen from Aluminum, Copper, Aluminum alloy, or Copper alloy as the input/output contact points of substrate circuitry for connecting chip(s).

Then, FIG. 3B shows the components in step 2. The first chip 220 has a first active surface 221, a first back surface 222 and a plurality of first bonding pads 223 disposed on the first active surface 221. By a known die bonder, the first chip 220 is disposed on the substrate 210 where the first back surface 222 of the first chip 220 is attached to the top surface 211 of the substrate 210 by an adhesive 230. Before step 2, various IC components and circuits had been fabricated on the first active surface 221 and electrically connected to the first bonding pads 223 where the first bonding pads 223 can be disposed on one single side, two opposing sides, peripheries, or center of the first active surface 221 of the first chip 220. In the present embodiment, the first bonding pads 223 are disposed at the center of the first active surface 221 as central pads.

To be described in more details, as shown in FIG. 3B again, the adhesive 230 can be pre-disposed on the die-attaching area (not shown in the figure) defined on the top surface 211 of the substrate 210 to adhere the first back surface 222 of the first chip 220 where the adhesive 230 can be B-stage films, adhesive films, epoxy, non-conductive paste or liquid paste. Preferably, the adhesive 220 is liquid paste for lower cost with the characteristics of better heat resistance, anti-humidity, and corrosion which can easily be disposed by dispensing or by printing. Alternatively, the adhesive 230 may be a die attach material and pre-coated on the first back surface 222 of the first chip 220 in wafer form and then adhere to the top surface 211 of the substrate 210 in step 2.

Then, step 3 is performed after disposing the first chip 220 to thermally cure the adhesive 230. Normally the substrate 210 along with the adhesive 230 and the first chip 220 can be put into the baking oven to thermally cure the adhesive 230 to become solid to firmly hold the first chip 220. Normal pressure provided by the baking oven is enough.

The first plasma cleaning step 4 is a preferable step and not an essential one. Step 4 is performed after thermally curing the adhesive and before the first wire-bonding step 5 to clean the surface of the first bonding pads 241 and the substrate to remove contamination and particles to enhance the bondability between the bonding wires and bonding pads/bonding fingers and also to increase the adhesion between the substrate and the molding compound. An Ar (argon) plasma is normally implemented in the plasma cleaning for physical cleaning and $O_2$ plasma for removing PR (C—H compound) and H2 plasma for cleaning oxides.

Then, FIGS. 3C and 4 show the components in step 5. In the first wire bonding step 5, a plurality of first bonding wires 241 are formed by wire bonding to electrically connect the first bonding pads 223 with the bonding fingers 213. The first bonding wires 241 formed by a wire bonder can be made of gold wires, aluminum wires, copper wires, and gold-silver alloy wires. In the present embodiment, as shown in FIG. 3C again, the first bonding wires 241 are formed by reserve bonding where the bonding fingers 213 of the substrate 210 are ball bonds and the first bonding pads 223 of the chip 220 are stitch bonds so that the loop height can be lower and more horizontal. However, it is not limited as in the other embodiment, the first bonding wires 241 can be formed by forward bonding. Preferably, a plurality of conductive bumps which may be stud bumps formed by wire bonders can be pre-disposed on the first bonding pads 223 of the first chip 220 where the stitch bonds of the first bonding wires 241 are bonded onto these conductive bumps to increase bondability to make lower loop heights and more horizontal wire shapes of the first bonding wires 241 with longer wire lengths. Each first bonding wire 241 has a loop-height section above the first active surface 221.

Then, FIG. 3D shows the components in step 6. At least a second chip 250 is disposed on the first chip 220 by the FOW adhesive 262. Without any limitations, step 6 to step 9 can be repeated to stack more numbers of the second chips 250 on top of the first chip 220 to increase memory capacitor or more functions. The second chip 250 has a second active surface 251, a second back surface 252, and a plurality of second bonding pads 253 on the second active surface 251. In the present embodiment, the first chip 220 and the second chip 250 can be the identical dies with the same functions and the same dimensions where the second bonding pads 253 can be located at the center of the second active surface 251. The first chip 220 and the second chip 250 are stacked with their active surfaces facing up.

As shown in FIG. 3D and FIG. 3E, the FOW adhesive 262 is formed on a dielectric layer 261 attached to the second back surface 252 of the second chip 250. The dielectric layer 261 electrically isolates the second chip 250 from the first bonding wires 241. Moreover, the FOW adhesive 262 encapsulates the loop-height sections of the first bonding wires 241 above the first active surface 221 and is attached to the first active surface 221, i.e., the wire loop portions of the first bonding wires 241 are encapsulated which is more vulnerable for wire sweeping during molding processes. The loop-height section of the first bonding wire 241 above the first active surface 221 is encapsulated by the FOW adhesive 262, as shown in FIG. 3E. Preferably, the encapsulated loop-height section is more than half of the length of the corresponding the first bonding wire. Since the dielectric layer 261 can prevent the first bonding wires 241 to physically contact the second back surface 252 of the second chip 250, therefore, the loop heights of the first bonding wires 241 can further be lower where the thickness of FOW adhesive 262 is not necessary to be higher than the loop heights of the first bonding wires 241. The FOW adhesive 262 is a polymer adhesive in the form of paste or liquid with mobility higher than the one of the dielectric layer 261. When the second chip 250 is disposed on the first chip 220, the FOW adhesive 262 should not be completely cured so that the FOW adhesive 262 can encapsulate the first bonding wires 241, adhere the second chip 250 before being cured, and support the second chip 250 for wire bonding after being cured. As a result, the method can effectively improve wire sweeping issues of chips with central pads. The dielectric layer 261 can ensure good electrical isolation between the second chip 250 and the first bonding wires 241 to avoid leakage and it can further lower the loop heights of the first bonding wires 241 so that thinner FOW adhesive 262 can be implemented to encapsulate longer bonding wires.

In the present embodiment, the dielectric layer 261 and the FOW adhesive 262 are formed to fully cover the back surface 252 of the second chip 250 in wafer form. Moreover, the dielectric layer 261 and the FOW adhesive 262 are formed in a composite tape in advance, that is to say, the dielectric layer 261 and the FOW adhesive 262 are carried by a release film when adhering the dielectric layer 261 to the second back surface 252 of the second chip 250 in wafer form. By one taping process, the dielectric layer 261 and the FOW adhesive 262 are combined with the second chip 250 before step 6. Additionally, the thickness of the dielectric layer 261 is thinner than the one of the FOW adhesive 262 similar to the thickness of DAF (Die Attach Film) of 20 μm with thermal-setting resin. The thickness of FOW adhesive 262 can be controlled under 80 μm such as 60 μm. Furthermore, the Tg (glass transition temperature) of the dielectric layer 261 is higher than the one of the FOW adhesive 262 to avoid penetration of the first bonding wires through the dielectric layer 261. In another variation embodiment, the dielectric layer 261 is a semiconductor oxidized layer from the second chip, for example, $SiO_2$.

Figure 6:
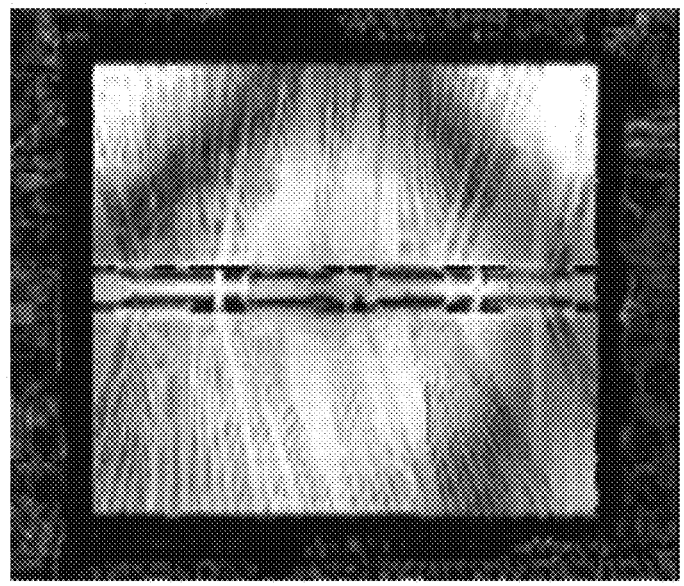
FIG. 6 is a photo showing cross section of the FOW adhesive after the thermally curing step with exerted pressures of the multi-chip stacking method according to the first embodiment of the present invention.
Figure 7:
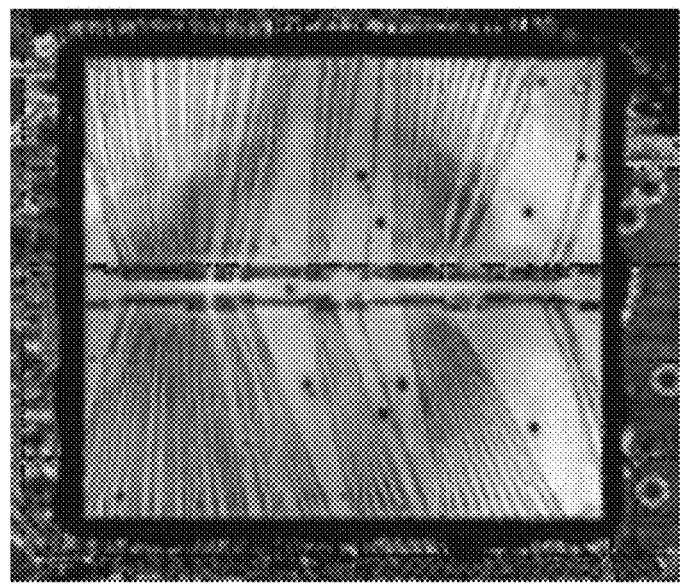
FIG. 7 is a photo showing horizontal cross section of the FOW adhesive before the thermally curing step with exerted pressures of the multi-chip stacking method according to the first embodiment of the present invention.

Then, FIG. 3E shows the components in step 7. The substrate 210 is placed inside a pressure oven 20 and the FOW adhesive 262 is thermally cured with exerted pressures where the pressure oven 20 provides a positive pressure greater than one atm exerted on the FOW adhesive 262 to reduce the voids trapped inside the FOW adhesive 262 so that there will be no voids trapped at the interfaces between the first active surface 221 of the first chip 220 and the FOW adhesive 262 to enhance the reliability and quality of the products. To be more specific, the positive pressure ranges from 1.8 atm to 8 atm and the heating temperature ranges from 100° C. to 160° C. higher than Tg of the FOW adhesive. To be described in detail, the temperature of the pressure oven 20 can be pre-set at the curing temperature with a pre-set pressure where the pressure oven 20 has a gas entrance 21 and an exhaust 22. The substrate 210 is placed on the stage 23 inside the pressure oven 20 and experienced heating and pressuring at the same time. When the temperature of the pressure oven 20 continues to rise and reach Tg of the FOW adhesive 262, The FOW adhesive 262 becomes fluid. By blowing more gases into the pressure oven 20 through the gas entrance 21, the positive pressure inside the pressure oven 20 keeps between 1.8 atm and 8 atm with the exhaust 22 open, i.e., the gas pressure at the gas entrance 21 ranges from 1 to 7 Kg/cm² to make the high-temperature gas inside the pressure oven 20 become high-pressure fluid and to force the bubbles or the solvent trapped inside the FOW adhesive 262 to evaporate inside the pressure oven 20 and to be vented from the exhaust 22 to keep good atmosphere inside the pressure oven 20. Moreover, the gas flow rate flowing out of the exhaust 22 should be smaller than the gas flow rate flowing into the gas entrance 21 to keep a positive pressure inside the pressure oven 20 to continuously force or shrink the bubbles trapped inside the FOW adhesive 262, in the mean time, FOW adhesive 262 is also cured under the above-described heating conditions. As shown in FIG. 6, there is no bubble trapped inside the FOW adhesive 262 after step 7 of thermally curing FOW adhesive 262 with exerted pressures to be a uniform structure. As shown in FIG. 7, before the FOW adhesive 262 is cured or after cured without any pressures, i.e., cured under one atm, there are bubbles (the dark spots in FIG. 7) trapped inside the FOW adhesive 262 leading to poor encapsulation of FOW adhesive 262. Without removing the bubbles, die strengths are reduced as well as possible popcorns will occur at the interfaces between the first chip 220 and the second chip 250 leading to serious reliability issues. Preferably, the dielectric layer 261 is also cured during step 7 of thermally curing FOW adhesive 262 with exerted pressures to reduce process steps to make the dielectric layer 261 more solid.

Then, the second plasma cleaning step 8 is preferably performed after the step 7 and before the second wire bonding step 9. Like the first plasma cleaning step 4, step 8 is not an essential step. The surfaces of the second bonding pads 253 are cleaned and any possible contaminations or particles on the substrate 210 are also removed to enhance the bondability between bonding wires and bonding pads/bonding fingers and to increase the adhesion between the substrate and the molding compound.

Then, FIG. 3F shows the components in step 9. In the second wire bonding step 9, a plurality of second bonding wires 242 are formed by wire bonding to electrically connect the second bonding pads 253 with the bonding fingers 213 so that the second chip 250 is electrically connected to the substrate 210. The second bonding wires 242 are formed by wire bonders where the material of the second bonding wires 242 can be the same as the first bonding wires 241 with reserve bonding. Preferably, when the second chip 250 is the topmost chip, a plurality of wire-fixing pastes 270 (as shown in FIG. 3G) are disposed on the second active surface 251 of the second chip 250 after the second wire bonding step 9 where the wire-fixing pastes 270 partially encapsulate the second bonding wires 242 to avoid wire sweeping of the second bonding wires 242 during molding processes leading to electrical short. To be more specific, the wire-fixing pastes 270 are incompletely adhered to the second active surface 251 in strip forms to encapsulate the portions of the second bonding wires 242 on the second active surface 251 which is more vulnerable for wire sweeping without covering the second bonding pads 253 to achieve fixing and partially encapsulating the second bonding wires 242. The bonding-wire fixing pastes 270 can be a thermal setting resin formed by dispensing or by printing where the bonding-wire fixing pastes 270 are dielectric with adhesive to increase the immovability of the second bonding wires 242 and to reduce possible wire sweeping due to the impact of mold flow during molding to avoid electrical short between bonding wires and to effectively improve wire sweeping issues especially for chips with central pads.

Then, FIG. 3G shows the components in step 10. A molding compound 280 is formed on top of the substrate 210 to encapsulate the first chip 220, the second chip 250, the rest unencapsulated portions of the first bonding wires 241, and the second bonding wires 242. The molding compound 280 is an epoxy molding compound (EMC) which can be formed by transfer molding or by compression molding to form on the top surface 211 of the substrate 210 where the molding compound 280 is cured to protect the chips and the bonding wires from damages or corrosions by external forces, moisture, material or others.

Then, FIG. 3H shows the components in step 11. A plurality of solder balls 290 are placed under the substrate 210, to be specific, on the ball pads on the bottom surface 212 of the substrate 210 in an array. Finally, the singulating step 12 is performed by sawing the substrate strip 201 and the molding compound 280 along the scribe lines 202 to form individual multi-chip packages 200 as shown in FIG. 5. The multi-chip package 200 can be surface-mounted on an eternal printed circuit board through the solder balls 290.

Figure 8:
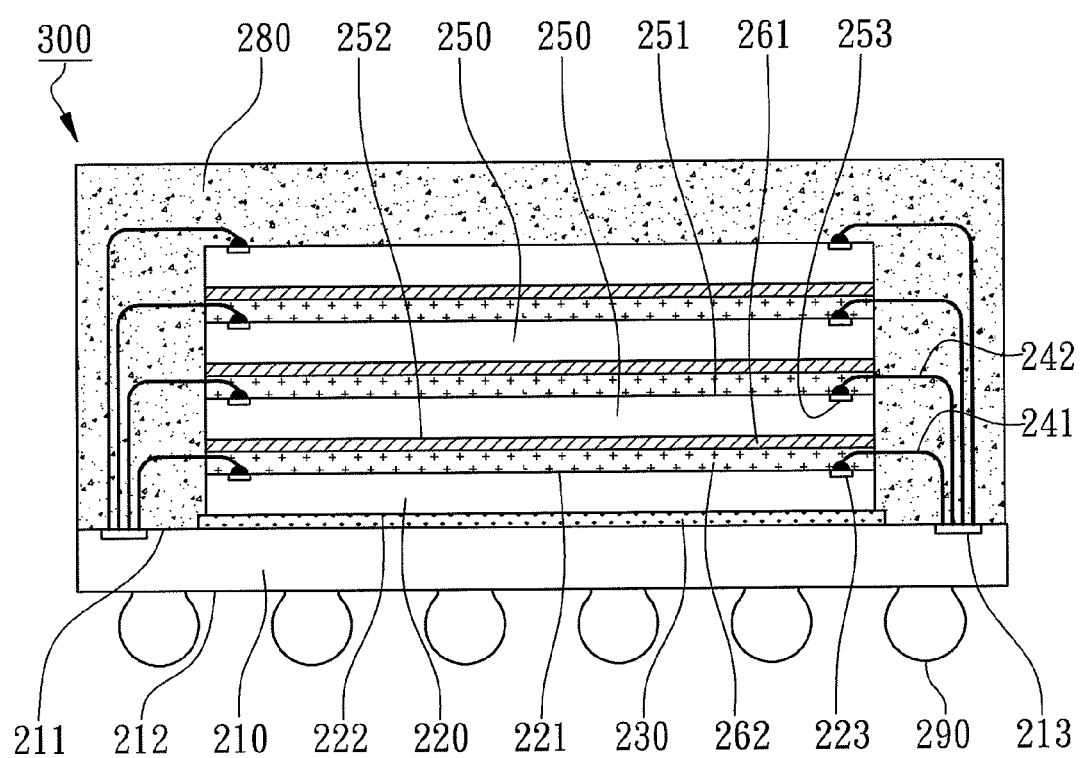
FIG. 8 is a cross-sectional view of another multi-chip package fabricated by the multi-chip stacking method according to the second embodiment of the present invention.

As shown in FIG. 8, another multi-chip package 300 is fabricated by the multi-chip stacking method according to the second embodiment of the present invention where the packaging process flow is the same as the first embodiment as shown in the block diagrams of FIG. 2 which is not be described in detail again. The major components of the multi-chip package 300 with the same nomenclature and assigned numbers are the same as the first embodiment which will be followed here.

In the present embodiment, the multi-chip package 300 comprises more vertically stacked second chips 250 to meet the requirements of miniature and high performance. As shown in FIG. 2 and FIG. 8, after first time of steps 9, the processes from step 6 to step 9 can be repeated so that more second chips 250 can be stacked on the lower second chip 250 to increase memory capacity or more functions. Whenever an extra second chip 250 is stacked, the step 7 is also repeatedly performed to reduce the bubbles trapped inside the FOW adhesive 262 between the second chips 250. The first chip 220 and the second chips 250 can be the chips with same dimensions and functions.

Furthermore, in the present embodiment, the first bonding pads 223 of the first chip 220 are located at the peripheries of the first active surface 221 and the second bonding pads 253 of the second chip 250 are also located at the peripheries of the second active surface 251 where the peripheral arrangements of the bonding pads 223/253 can be one-single side, two opposing sides, or peripheries to shorten the wire lengths of the first bonding wires 241 and the second bonding wires 242 to avoid wire sweeping. The first bonding wires 241 and the second bonding wires 242 can be formed by forward bonding.

Therefore, through thermally curing FOW adhesive by exerted pressures as a technical mean according to the present invention, the substrate is placed inside a pressure oven with a positive pressure greater than one atm to reduce the bubble trapped inside the FOW adhesive and to encapsulate the bonding wires with a thinner FOW adhesive to avoid poor adhesion between stacked chips and possible popcorn issues to greatly enhance the quality and reliability of the multi-chip packages.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A multi-chip stacking method to reduce voids between stacked chips comprising:

providing a substrate having a top surface and a plurality of bonding fingers;

disposing a first chip on the substrate by an adhesive, wherein the first chip has a first active surface, a first back surface, and a plurality of first bonding pads disposed on the first active surface, the adhesive adheres the first back surface of the first chip to the top surface of the substrate;

thermally curing the adhesive;

forming a plurality of first bonding wires by wire-bonding to electrically connect the first bonding pads to the bonding fingers;

disposing the second chip on the first active surface of the first chip by a FOW adhesive, wherein the second chip has a second active surface, a second back surface, and a plurality of second bonding pads disposed on the second active surface, wherein the FOW adhesive is formed on an dielectric layer attached onto the second back surface of the second chip, and the FOW adhesive encapsulates a plurality of loop-height sections of the first bonding wires above the first active surface and is attached to the first active surface of the first chip; and placing the substrate inside a pressure oven and thermally curing the FOW adhesive with exerted pressures to provide a positive pressure greater than one atm exerted on the FOW adhesive to reduce bubbles trapped inside the FOW adhesive.

2. The multi-chip stacking method as claimed in claim 1, wherein the positive pressure in the pressure oven is maintained between 1.8 atm to 8.0 atm during thermally curing the FOW adhesive with exerted pressures.

3. The multi-chip stacking method as claimed in claim 2, wherein the first chip and the second chip are the chips with the same dimensions and functions, wherein the first bonding pads are located at a central region of the first active surface and the second bonding pads are located at a central region of the second active surface.

4. The multi-chip stacking method as claimed in claim 2, wherein the first chip and the second chip are the chips with the same dimensions and functions, wherein the first bonding pads are located at peripheries of the first active surface and the second bonding pads are located at peripheries of the second active surface.

5. The multi-chip stacking method as claimed in claim 1, wherein the dielectric layer on the second back surface and the FOW adhesive are formed to fully cover the second back surface in wafer form.

6. The multi-chip stacking method as claimed in claim 1, further comprising a second wire bonding step performed after thermally curing the FOW adhesive with exerted pressures to form a plurality of second bonding wires to electrically connect the second bonding pads to the bonding fingers.

7. The multi-chip stacking method as claimed in claim 6, further comprising a first plasma cleaning step performed after thermally curing the adhesive and before forming the first bonding wires to clean the first bonding pads.

8. The multi-chip stacking method as claimed in claim 7, further comprising a second plasma cleaning step performed after thermally curing the FOW adhesive with exerted pressures and before forming the second bonding wires to clean the second bonding pads.

9. The multi-chip stacking method as claimed in claim 6, further comprising a molding step performed after forming the second bonding wires to form a molding compound on the substrate to encapsulate the first chip, the second chip, the first bonding wires, and the second bonding wires.

10. The multi-chip stacking method as claimed in claim 9, further comprising a ball planting step after the molding step to plant a plurality of solder balls on a bottom surface of the substrate.

11. The multi-chip stacking method as claimed in claim 9, further comprising the step of disposing a plurality of wire-fixing pastes on the second active surface of the second chip after the second wire bonding step, wherein the wire-fixing pastes partially encapsulates the second bonding wires.

12. The multi-chip stacking method as claimed in claim 11, wherein the wire-fixing pastes are incompletely adhered to the second active surface without covering the second bonding pads.

13. The multi-chip stacking method as claimed in claim 1, wherein the dielectric layer is also cured during the step of thermally curing the FOW adhesive with exerted pressures.

14. The multi-chip stacking method as claimed in claim 1, wherein at least one of the encapsulated loop-height sections is more than half of the length of the corresponding the first bonding wire.

15. The multi-chip stacking method as claimed in claim 1, wherein the first bonding wires are formed by reserve bonding to have a plurality of ball bonds on the bonding fingers and a plurality of stitch bonds on the first bonding pads.

16. The multi-chip stacking method as claimed in claim 15, wherein a plurality of conductive bumps formed by wire bonders are pre-disposed on the first bonding pads for connecting the stitch bonds during forming the first bonding wires.

17. The multi-chip stacking method as claimed in claim 1, wherein the pressure oven has a gas entrance and an exhaust to make the gas inside the pressure oven become high-pressure fluid when the FOW adhesive is cured.

* * * * *